(12) United States Patent
Lee et al.

(10) Patent No.: US 11,355,674 B2
(45) Date of Patent: Jun. 7, 2022

(54) SEMICONDUCTOR DEVICE PACKAGE

(71) Applicant: SUZHOU LEKIN SEMICONDUCTOR CO., LTD., Taicang (CN)

(72) Inventors: Koh Eun Lee, Seoul (KR); Hui Seong Kang, Seoul (KR); Min Ji Jin, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 64 days.

(21) Appl. No.: 16/772,867

(22) PCT Filed: Dec. 21, 2018

(86) PCT No.: PCT/KR2018/016428
§ 371 (c)(1),
(2) Date: Jun. 15, 2020

(87) PCT Pub. No.: WO2019/125032
PCT Pub. Date: Jun. 27, 2019

(65) Prior Publication Data
US 2020/0350468 A1    Nov. 5, 2020

(30) Foreign Application Priority Data
Dec. 22, 2017 (KR) .................. 10-2017-0177995

(51) Int. Cl.
*H01L 33/48* (2010.01)
*H01L 33/38* (2010.01)
*H01L 33/56* (2010.01)
*H01L 33/62* (2010.01)
*H01L 33/64* (2010.01)

(52) U.S. Cl.
CPC ............ *H01L 33/486* (2013.01); *H01L 33/38* (2013.01); *H01L 33/56* (2013.01); *H01L 33/62* (2013.01); *H01L 33/64* (2013.01)

(58) Field of Classification Search
CPC ....... H01L 33/486; H01L 33/38; H01L 33/56; H01L 33/62; H01L 33/64; H01L 25/167; H01L 33/48; H01L 33/20
See application file for complete search history.

(56) References Cited

U.S. PATENT DOCUMENTS 7,361,940 B2 * 4/2008 Kim .................... H01L 23/4334
257/100
2004/0079957 A1 * 4/2004 Andrews ................ H01L 33/60
257/100

(Continued)

FOREIGN PATENT DOCUMENTS

| KR | 10-2012-0082190 | 7/2012 |
| KR | 10-2012-0127109 | 11/2012 |
| KR | 10-2014-0057805 | 5/2014 |
| KR | 10-2017-0118511 | 10/2017 |

OTHER PUBLICATIONS

International Search Report dated Mar. 21, 2019 issued in Application No. PCT/KR2018/016428.

*Primary Examiner* — Jonathan Han
(74) *Attorney, Agent, or Firm* — Birch, Stewart, Kolasch & Birch, LLP

(57) ABSTRACT

An embodiment discloses a semiconductor device package, comprising: a body including a cavity; a plurality of electrodes disposed inside the body; a semiconductor device disposed in the cavity of the body; and a transparent member disposed on the cavity, wherein the body comprises: a first side surface and a second side surface facing each other, and a third side surface and a fourth side surface facing each other; a first corner area formed by the first side surface and the third side surface; a second corner area formed by the first side surface and the fourth side surface; a third corner area formed by the second side surface and the fourth side surface; and a fourth corner area formed by the second side surface and the third side surface, and wherein the plurality (Continued)

of electrodes comprises a first electrode on which the semiconductor device is disposed, wherein the first electrode comprises: a fifth side surface and a sixth side surface facing each other; a seventh side surface connecting the fifth side surface and the sixth side surface; a fifth corner area formed by the fifth side surface and the seventh side surface; and a sixth corner area formed by the sixth side surface and the seventh side surface, wherein the fifth corner area is disposed between the second corner area and the third corner area, and the sixth corner area is disposed between the third corner area and the fourth corner area.

21 Claims, 9 Drawing Sheets

(56) References Cited

U.S. PATENT DOCUMENTS

| | | | |
|---|---|---|---|
| 2008/0023721 A1* | 1/2008 | Lee | H01L 33/486 257/99 |
| 2012/0056217 A1* | 3/2012 | Jung | H01L 33/48 257/89 |
| 2012/0181569 A1* | 7/2012 | Choi | H01L 33/62 257/99 |
| 2012/0286319 A1* | 11/2012 | Lee | H01L 33/642 257/99 |

* cited by examiner

[FIG. 1]
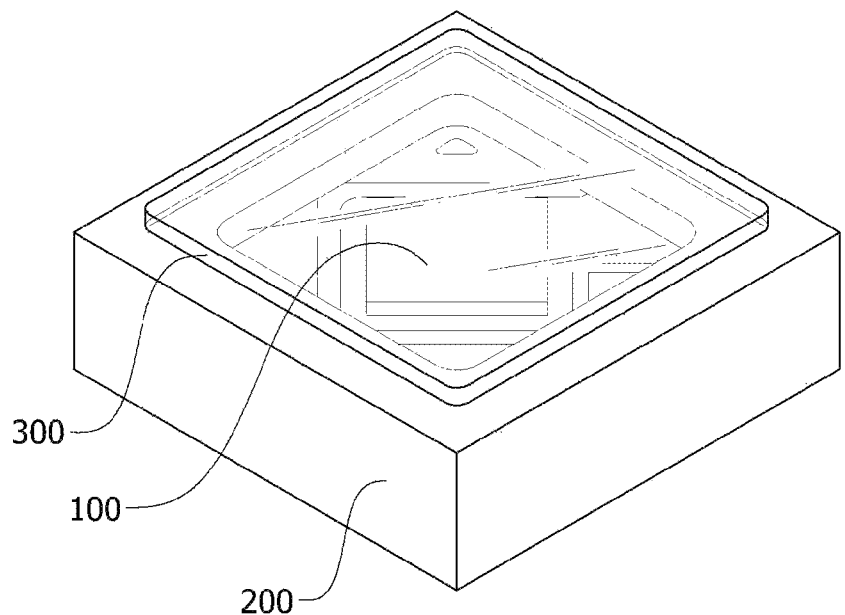
[FIG. 2]
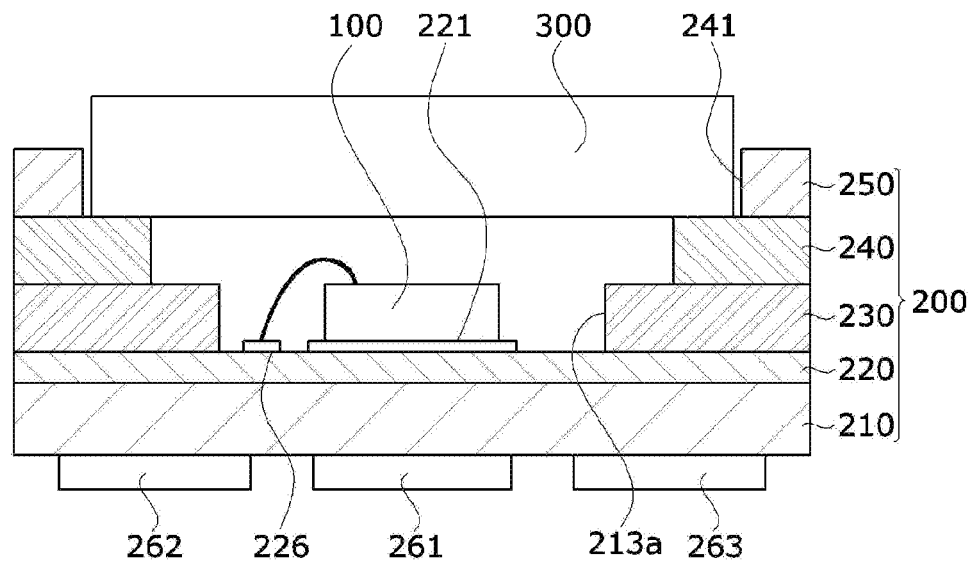

[FIG. 3]
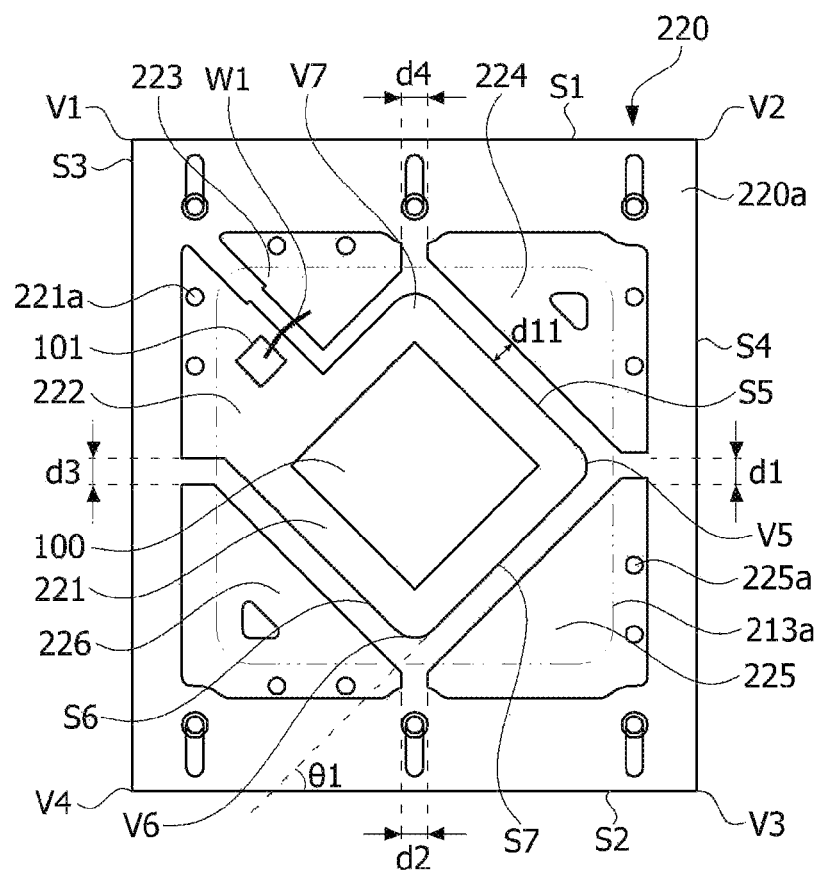

[FIG. 4]
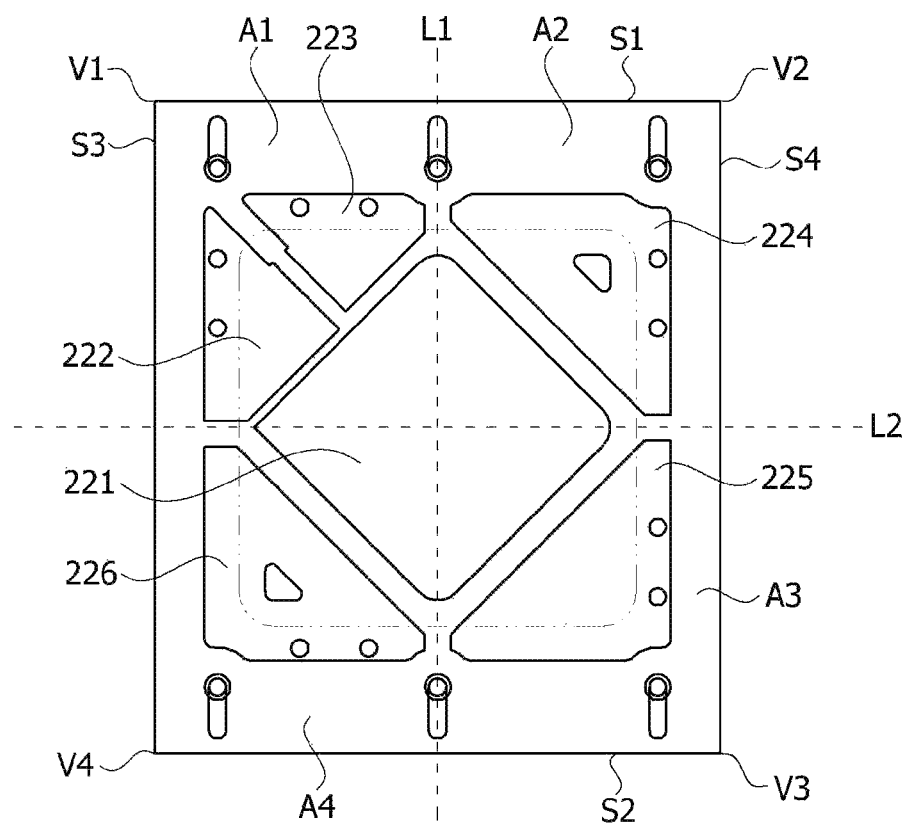

[FIG. 5]
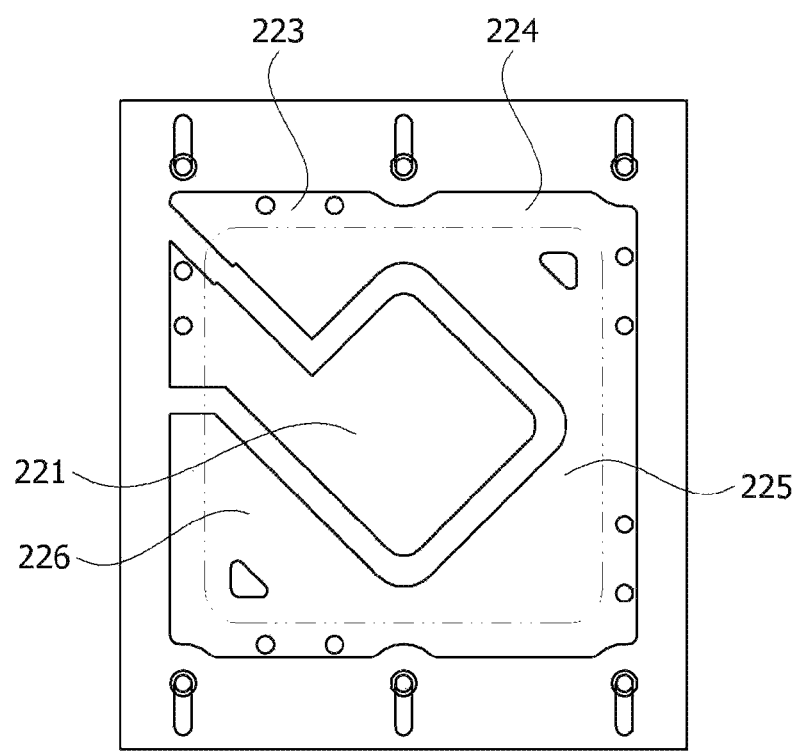

[FIG. 6]
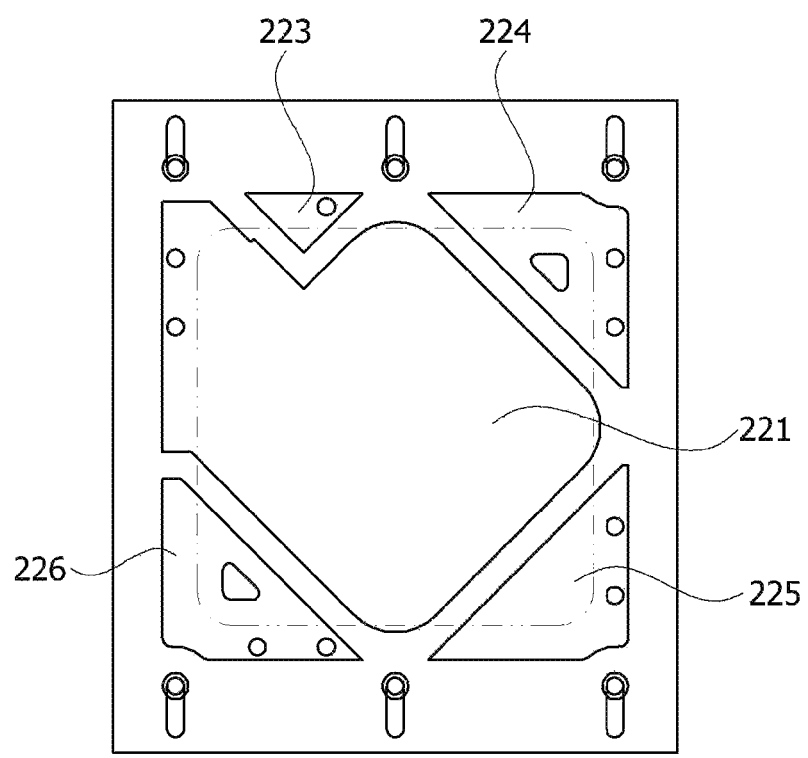

【FIG. 7】
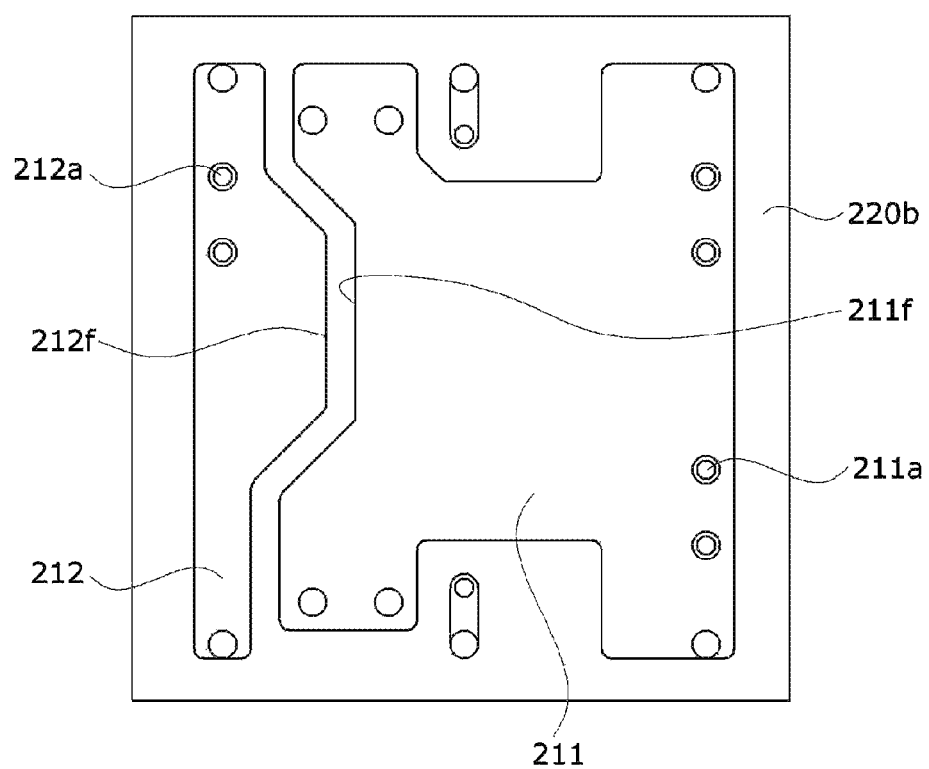

【FIG. 8】
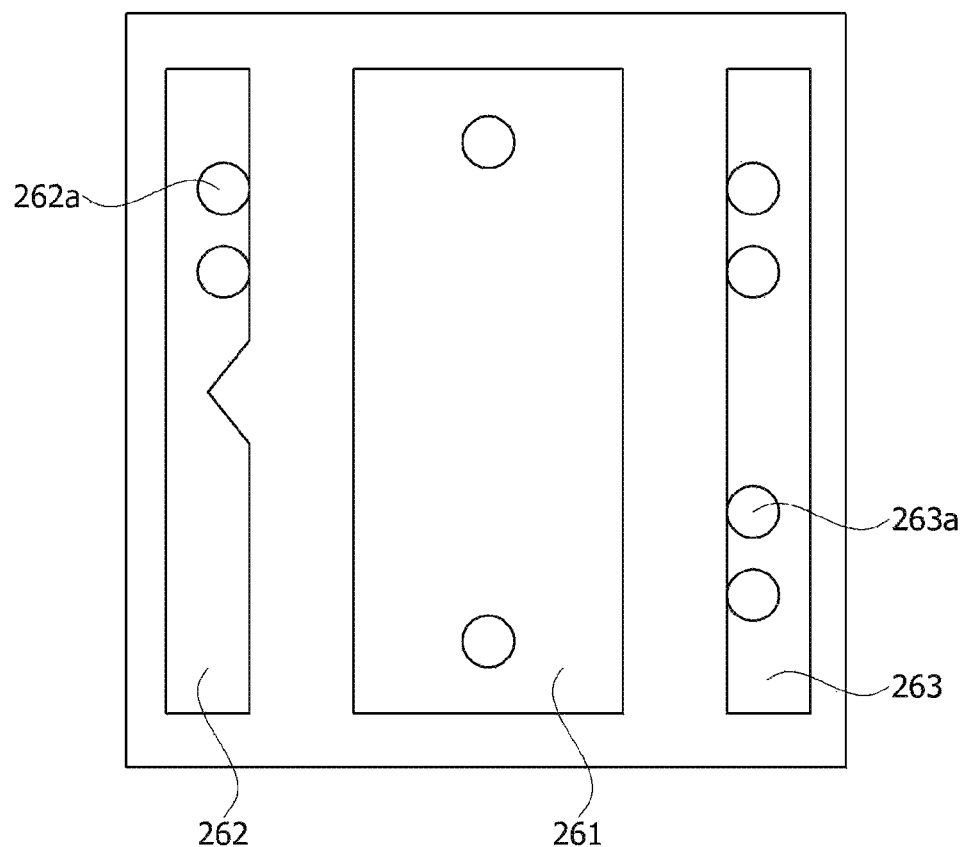

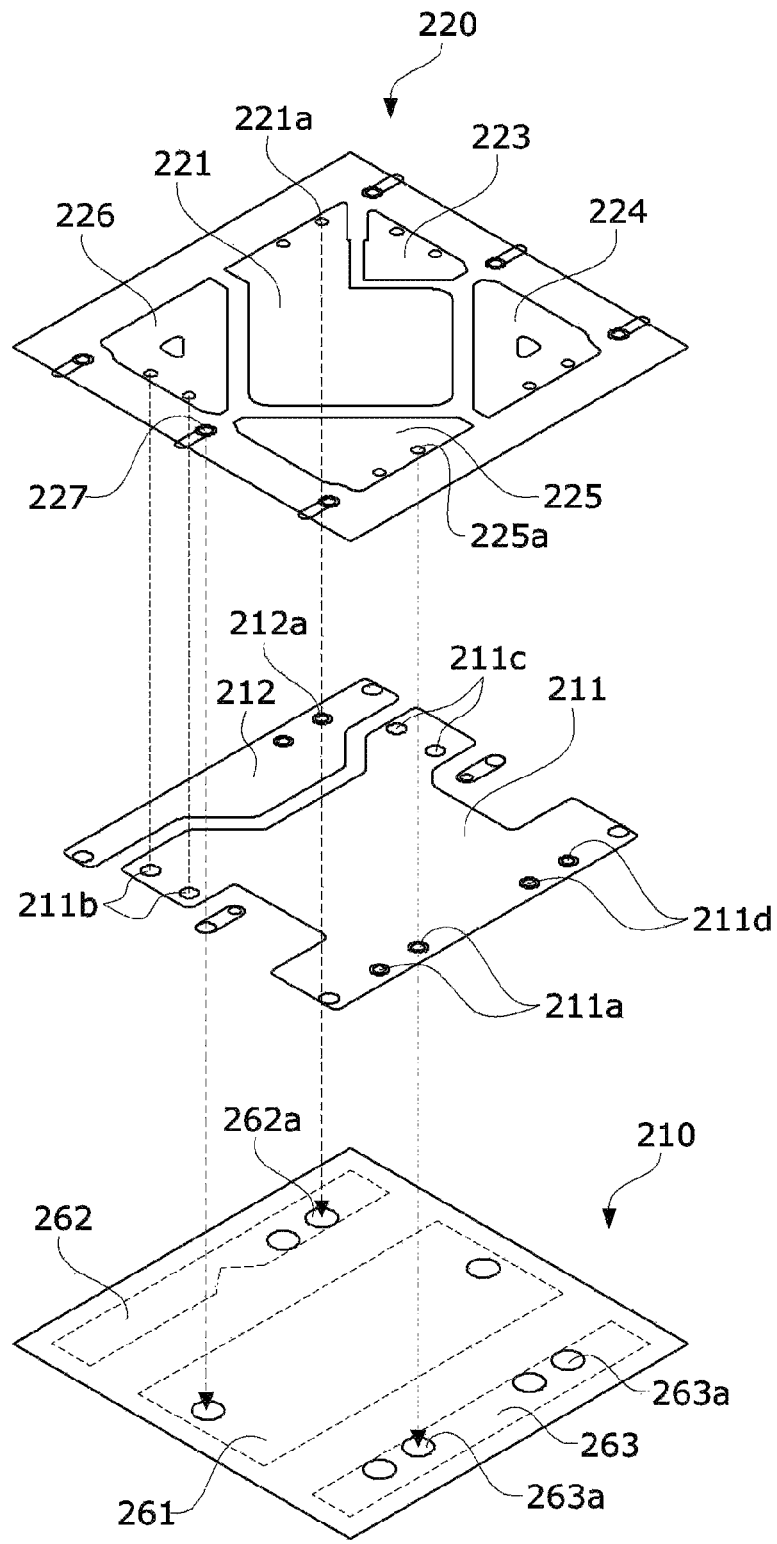
[FIG. 9]

【FIG. 10】
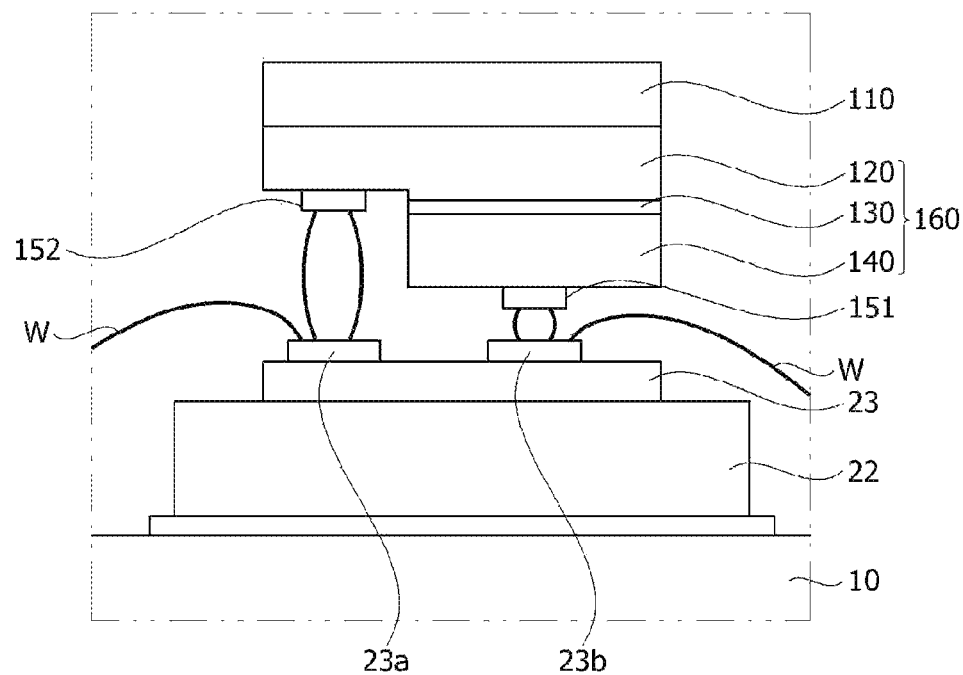
【FIG. 11】
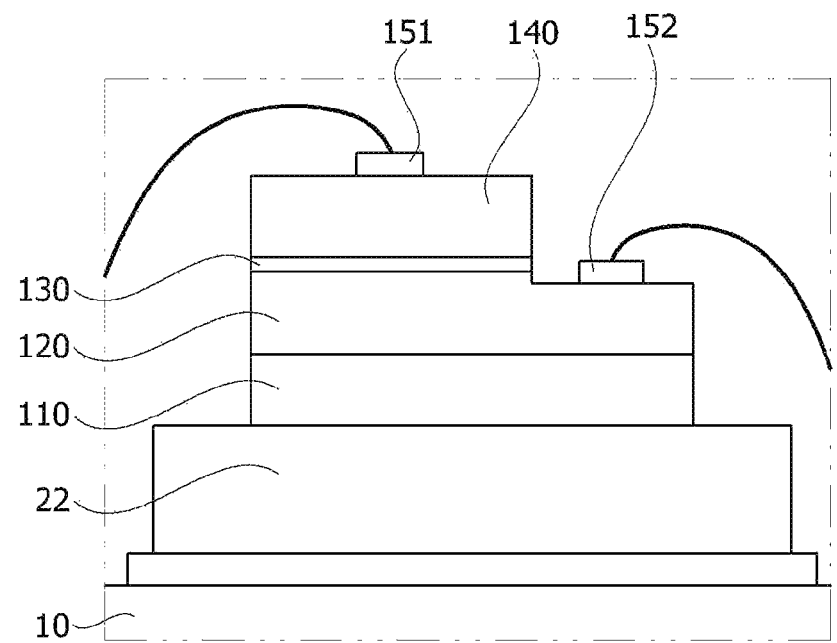

SEMICONDUCTOR DEVICE PACKAGE

CROSS-REFERENCE TO RELATED PATENT APPLICATIONS

This application is a U.S. National Stage Application under 35 U.S.C. § 371 of PCT Application No. PCT/KR2018/016428, filed Dec. 21, 2018, which claims priority to Korean Patent Application No. 10-2017-0177995, filed Dec. 22, 2017, whose entire disclosures are hereby incorporated by reference.

TECHNICAL FIELD

Embodiments relate to semiconductor device packages.

BACKGROUND ART

Semiconductor devices, which include compounds such as GaN and AlGaN, have many advantages, e.g., wide and easily controllable bandgap energy and thus may be variously used in light-emitting elements, light-receiving elements, various diodes, and the like.

In particular, light-emitting elements, such as a light-emitting diode or a laser diode using a Group III-V compound semiconductor material or a Group II-VI compound semiconductor material of a semiconductor, are capable of not only emitting various-color rays, such as red, green, blue and ultraviolet rays, owing to development of thin-film growth technology and element materials but also emitting high-efficiency white light beams using fluorescent materials or combination of colors and have advantages, such as low power consumption, semi-permanent lifetime, a quick response rate, safety, and environmental friendliness, compared to existing light sources such as fluorescent lamps and incandescent lamps.

Furthermore, when a light-receiving device such as a photodetector or a solar cell is manufactured using a Group III-V compound semiconductor material or a Group II-VI compound semiconductor material of a semiconductor, photocurrent may be generated by absorbing light in various wavelength regions due to development of a device material so that light in various wavelength ranges ranging from gamma rays to radio wavelength regions may be used. In addition, semiconductor devices have advantages, e.g., a quick response rate, safety, environmental friendliness and easy controllability of device materials and thus are easily applicable to power control or microwave circuits or communication modules.

Accordingly, applications of semiconductor devices have been expanded to a transmission module of an optical communication unit, a light-emitting diode backlight unit which may replace a cold cathode fluorescent lamp (CCFL) of a backlight unit of a liquid crystal display (LCD) device, a white light-emitting diode illumination device which may replace a fluorescent lamp or an incandescent lamp, headlights for vehicles, traffic lights, and sensors for sensing gas and fire. In addition, applications of semiconductor devices may be expanded to high-frequency application circuits, other power control devices, and communication modules.

Particularly, light-emitting elements that emit light in an ultraviolet wavelength region may be used for curing, medical, and sterilization purposes by curing or sterilizing.

Recently, research on ultraviolet light-emitting element packages has been actively conducted but there is a problem in that internal heat may not be effectively discharged to the outside. In addition, there is a limit in a chip size in packages with the same size.

SUMMARY OF THE INVENTION

An embodiment provides a semiconductor device package having excellent heat dissipation efficiency.

An embodiment provides a semiconductor device package in which large chips may be manufactured in the same size.

Aspects of embodiments are not limited thereto and should be understood to include objects or effects that can be figured out from the technical solution or modes of the invention described below.

One aspect of the present invention provides a semiconductor device package including: a body with a cavity; a plurality of electrodes disposed inside the body; a semiconductor device electrically connected to the plurality of electrodes; and a transparent member disposed in the cavity. The body includes a first side surface and a second side surface facing each other, a third side surface and a fourth side surface facing each other, a first corner area formed by the first side surface and the third side surface, a second corner area formed by the first side surface and the fourth side surface, a third corner area formed by the second side surface and the fourth side surface, and a fourth corner area formed by the second side surface and the third side surface. The plurality of electrodes include a first electrode on which the semiconductor device is disposed. The first electrode includes a fifth side surface and a sixth side surface facing each other; a seventh side surface connecting the fifth side surface and the sixth side surface, a fifth corner area formed by the fifth side surface and the seventh side surface, and a sixth corner area formed by the sixth side surface and the seventh side surface. The fifth corner area is located between the second corner area and the third corner area, and the sixth corner area is located between the third corner area and the fourth corner area.

The plurality of electrodes may include second to sixth electrodes disposed outside the first electrode, and the second to sixth electrodes may be disposed to be spaced apart from one another.

The second electrode may extend to the first corner area and be connected to the first electrode.

The semiconductor device package may include a Zener diode disposed on the second electrode.

Advantageous Effects

According to an embodiment of the present invention, heat dissipation efficiency can be enhanced by a heat dissipation pad. In addition, large chips may be manufactured in the same package size.

Various and beneficial advantages and effects of the present invention are not limited to the above description and will be more easily understood in the course of describing specific embodiments of the present invention.

BRIEF DESCRIPTION OF THE DRAWINGS

FIG. 1 is a perspective view of a semiconductor device package according to an embodiment of the present invention.

FIG. 2 is a cross-sectional view of a semiconductor device package according to an embodiment of the present invention.

FIG. 3 is a diagram illustrating an electrode pattern layer.
FIG. 4 illustrates a first modified example of FIG. 3.
FIG. 5 illustrates a second modified example of FIG. 3.
FIG. 6 illustrates a third modified example of FIG. 3.
FIG. 7 is a diagram illustrating a connection electrode.
FIG. 8 is a diagram illustrating a first electrode pad and a second electrode pad.
FIG. 9 is a diagram illustrating a structure in which an electrode pattern layer, a connection electrode, and an electrode pad are electrically connected to one another.
FIG. 10 is a conceptual diagram of a semiconductor device according to an embodiment of the present invention.
FIG. 11 illustrates a modified example of FIG. 10.

DETAILED DESCRIPTION

Embodiments may be embodied in many different forms or implemented in various combinations, and the scope of the present invention is not limited to embodiments described below.

Although matters described in a certain embodiment are not described in another embodiment, the matters may be understood in relation to the other embodiment unless described otherwise or contradictory to the matters.

For example, when features of a configuration A are described in a certain embodiment and features of a configuration B are described in another embodiment, it is to be understood that they fall within the scope of the present invention unless described otherwise or contradictory to the description, even when an embodiment in which the configuration A and the configuration B are combined is not explicitly described.

When one element is referred to as being formed "on" or "under" another element in embodiments, it will be understood that the two elements are formed to be in direct contact with each other or to be in indirect contact with each other while one or more elements are interposed therebetween. The expression "on or under one element" should be understood to mean not only an upward direction but also a downward direction with respect to the element.

Hereinafter, embodiments of the present invention will be described in detail with reference to the accompanying drawings so that they may be easily implemented by those of ordinary skill in the technical field to which the present invention pertains.

FIG. 1 is a perspective view of a semiconductor device package according to an embodiment of the present invention. FIG. 2 is a cross-sectional view of the semiconductor device package according to the embodiment of the present invention.

Referring to FIGS. 1 and 2, the semiconductor device package according to the embodiment may include a body 200 with a cavity 213a, a semiconductor device 100 disposed in the cavity 213a of the body 200, and a transparent member 300 disposed in the cavity 213a.

The body 200 may include a material or a coating layer that reflects ultraviolet light. The body 200 may be formed by stacking a plurality of sublayers 210, 220, 230, 240, and 250. The plurality of sublayers 210, 220, 230, 240, and 250 may include the same material or different materials. For example, the plurality of sublayers 210, 220, 230, 240, and 250 may include a ceramic material but are not limited thereto. The plurality of sublayers 210, 220, 230, 240, and 250 may be fixed to one another by an adhesive.

The semiconductor device 100 may output light in an ultraviolet wavelength range. For example, the semiconductor device 100 may output light (UV-A) in a near-ultraviolet wavelength range, light (UV-B) in a far-ultraviolet wavelength range, or light (UV-C) in a deep-ultraviolet wavelength range. A wavelength range may be determined by an Al composition ratio of a semiconductor structure.

For example, the light (UV-A) in the near-ultraviolet wavelength range may have a maximum peak in a range of 320 nm to 420 nm, the light (UV-B) in the far-ultraviolet wavelength range may have a maximum peak in a range of 280 nm to 320 nm, and the light (UV-C) of the deep-ultraviolet wavelength range may have a maximum peak in a range of 100 nm to 280 nm.

The transparent member 300 may be disposed in the cavity 213a. The transparent member 300 may be supported by a stepped region 241 between the fourth sublayer 240 and the fifth sublayer 250. An adhesive (not shown) may be applied between the stepped region 241 and the transparent member 300. The adhesive may be an ultraviolet (UV)-curable resin but is not limited thereto.

A material of the transparent member 300 is not particularly limited, provided that the material allows light in the ultraviolet wavelength range to pass therethrough. For example, a transparent layer may include an optical material having high ultraviolet wavelength transmittance, such as quartz, but is not limited thereto.

A first electrode pad 262, a second electrode pad 263, and a heat dissipation pad 261 disposed between the first electrode pad 262 and the second electrode pad 263 may be disposed below the first sublayer 210. For example, the first electrode pad 262 may be electrically connected to an electrode 221 on which the semiconductor device 100 is disposed, and the second electrode pad 263 may be electrically connected to another electrode 226.

In an embodiment, it is illustrated that a semiconductor device is connected by a wire but an electrode connection structure may be variously modified according to an electrode structure of the semiconductor device, FIG. 3 is a diagram illustrating an electrode pattern layer. FIG. 4 illustrates a first modified example of FIG. 3. FIG. 5 illustrates a second modified example of FIG. 3. FIG. 6 illustrates a third modified example of FIG. 3.

Referring to FIG. 3, a plurality of electrodes 221, 222, 223, 224, 225, and 226 may be disposed on a surface 220a of a second sublayer 220. The second sublayer 220 may include an insulating material such as AlN.

The second sublayer 220 of a body may include a first side surface S1 and a second side surface S2 facing each other, a third side surface S3 and a fourth side surface S4 facing each other, a first corner area V1 formed by the first side surface S1 and the third side surface S3, a second corner area V2 formed by the first side surface S1 and the fourth side surface S4, a third corner area V3 formed by the second side surface S2 and the fourth side surface S4, and a fourth corner area V4 formed by the second side surface S2 and the third side surface S3.

The plurality of electrodes 221, 222, 223, 224, 225, and 226 may include the first electrode 221 on which a semiconductor device 100 is disposed. The first electrode 221 may include a fifth side surface S5 and a sixth side surface S6 facing each other, a seventh side surface S7 connecting the fifth side surface S5 to the sixth side surface S6, a fifth corner area V5 formed by the fifth side surface S5 and the seventh side surface S7, and a sixth corner area V6 formed by the sixth side surface S6 and the seventh side surface S7.

A first angle θ1 formed by a side surface of the first electrode 221 and a side surface of the body may be in a range of 30 to 60 degrees. That is, the first electrode 221 according to an embodiment may be disposed by being rotated at a certain angle with reference to the body. According to the configuration, a chip mounting area may be increased in a package with the same size by increasing an area of the first electrode 221. Accordingly, a chip having a large area may be mounted. Alternately, the number of chips to be mounted may be increased.

The first electrode 221 may have a rectangular shape but is not limited thereto. For example, the first electrode 221 may be connected to the second electrode 222 extending toward the first corner area V1.

A Zener diode 101 may be disposed on the second electrode 222. The Zener diode 101 may be electrically connected to the third electrode 223 neighboring the second electrode 222 by a wire W1.

The second to sixth electrodes 222, 223, 224, 225, and 226 may be disposed to surround the first electrode 221. The second to sixth electrodes 222, 223, 224, 225, and 226 may be spaced apart from one another. The first electrode 221 may be larger than the second to sixth electrodes 222, 223, 224, 225, and 226. The fourth to sixth electrodes 224, 225, and 226 may be larger than the second and third electrodes 222 and 223.

Surfaces of the second to sixth electrodes 222, 223, 224, 225, and 226 which face the first electrode 221 may be parallel to the first electrode 221. A first distance d11 between the second to sixth electrodes 222, 223, 224, 225, and 226 and the first electrode 221 may be in a range of 50 μm to 150 μm.

When the first distance d11 is greater than or equal to 50 μm, insulation between electrodes may be ensured. When the first distance d11 is less than or equal to 150 μm, a package size may be reduced.

In detail, the third electrode 223 and the fourth electrode 224 may be disposed adjacent to the first side surface S1 and spaced apart from each other. The fourth electrode 224 and the fifth electrode 225 may be disposed adjacent to the fourth side surface S4 and spaced apart from each other. The fifth electrode 225 and the sixth electrode 226 may be disposed adjacent to the second side surface S2 and spaced apart from each other. The sixth electrode 226 and the second electrode 222 may be disposed adjacent to the third side surface S3 and spaced apart from each other.

A width of a first gap d1 between the fourth electrode 224 and the fifth electrode 225 and a width of a second gap d2 between the fifth electrode 225 and the sixth electrode 226 may vary according to an area of the first electrode 221. That is, as the area of the first electrode 221 increases, the widths of the first gap d1 and the second gap d2 may increase. Accordingly, a chip having a large area may be mounted by increasing the area of the first electrode 221, and a package size may be maintained by reducing areas of the third to sixth electrodes 223, 224, 225, and 226.

The first gap d1 between the fourth electrode 224 and the fifth electrode 225 may be located between the fifth corner area V5 and the fourth side surface S4. The second gap d2 between the fifth electrode 225 and the sixth electrode 226 may be located between the sixth corner area V6 and the second side surface S2. A third gap d3 may be located between the second electrode 222 and the sixth electrode 226. A fourth gap d4 may be located between a seventh corner area V7 and the first side surface S1.

According to an embodiment, because the first electrode 221 is disposed by being rotated in a clockwise or counterclockwise direction with reference to the body, widths of gaps between the third to sixth electrodes 223, 224, 225, and 226 may be increased such that the first electrode 221 is not in contact with the fifth corner area V5 and the sixth corner area V6.

Widths of the first gap d1 and the second gap d2 may be in a range of 50 μm to 250 μm. When the first gap d1 and the second gap d2 is greater than 50 μm, an area of the first electrode 221 may be increased, and thus a chip with a large area may be mounted. When a gap therebetween is less than 250 μm, a wire may be mounted by ensuring areas of the third to sixth electrodes 223, 224, 225, and 226. FIG. 3 also illustrates a through hole 221*a* in the first electrode 221 connected to the second electrode 222, and a through hole 225*a* in the fifth electrode 225.

Referring to FIG. 4, the first electrode 221 may be separated from the second electrode 222. Except that the first electrode 221 is separated from the second electrode 222 in FIG. 4, all configurations of FIG. 3 may be applied to FIG. 4.

A body may include first to fourth division areas A1, A2, A3, and A4 defined by a first virtual line L1 passing through centers of the first side surface S1 and the second side surface S2 and a second virtual line L2 passing through centers of the third side surface S3 and the fourth side surface S4.

The first division area A1 may include the first corner area V1. The second division area A2 may include the second corner area V2. The third division area A3 may include the third corner area V3. The fourth division area A4 may include the fourth corner area V4.

Accordingly, the second electrode 222 and the third electrode 223 may be disposed in the first division area A1. The fourth electrode 224 may be disposed in the second division area A2. The fifth electrode 225 may be disposed in the third division area A3. The sixth electrode 226 may be disposed in the fourth division area A4.

The first electrode 221 may include a point at which the first virtual line L1 crosses the second virtual line L2. In addition, the first electrode 221 may be disposed in all of the first division area A1 to the fourth division area A4.

The second to sixth electrodes 222, 223, 224, 225, and 226 may be disposed to surround the first electrode 221. The second to sixth electrodes 222, 223, 224, 225, and 226 may be disposed to be spaced apart from one another. The first electrode 221 may be larger than the second to sixth electrodes 222, 223, 224, 225, and 226. In addition, the fourth to sixth electrodes 224, 225, and 226 may be larger than the second and third electrodes 222 and 223.

According to an embodiment, a chip mounting area may be increased in a package with the same size by adjusting an area of the first electrode 221. Accordingly, a chip having a large area may be mounted. Alternately, the number of chips to be mounted may be increased.

Referring to FIG. 5, as an area of the first electrode 221 increases, widths of gaps of the third to sixth electrodes 223, 224, 225, and 226 may increase. That is, areas of the third to sixth electrodes 223, 224, 225, and 226 may decrease.

In contrast, as shown in FIG. 6, when an area of the first electrode 221 decreases, the areas of the third to sixth electrodes 223, 224, 225, and 226 may increase and thus be connected to one another.

The area of the first electrode 221 may account for 50% to 150% of the area of the other electrodes. The area of the other electrodes may be the same as the sum of the areas of the second to sixth electrodes 222, 223, 224, 225, and 226. When the area of the first electrode 221 is greater than 50% of the area of the other electrodes, a chip having a large area may be mounted in the same package. When the area of the first electrode 221 is less than 150% thereof, an area in which wires may be formed may be ensured in the fourth to sixth electrodes 224, 225, and 226.

FIG. 7 is a diagram illustrating a connection electrode. FIG. 8 is a diagram illustrating a first electrode pad and a second electrode pad. FIG. 9 is a diagram illustrating a structure in which an electrode pattern layer, a connection electrode, and an electrode pad are electrically connected to one another.

Referring to FIG. 7, a first connection electrode 212 and a second connection electrode 211 may be disposed on a lower surface 220*b* of the second sublayer 220. That is, with respect to the second sublayer 220, a plurality of electrodes may be disposed on an upper surface 220*a*, and the first connection electrode 212 and the second connection electrode 211 may be disposed on the lower surface of 220*b*.

The first sublayer 210 and the second sublayer 220 may be bonded to each other through the first connection electrode 212 and the second connection electrode 211. Both the first sublayer 210 and the second sublayer 220 are formed of an insulating material such as AlN and thus may be relatively difficult to bond to each other. Accordingly, in an embodiment, the first connection electrode 212 and the second connection electrode 211 may not only connect the first sublayer 210 to the second sublayer 220 but also function as electrical connection paths.

The first connection electrode 212 may include a convex portion 212*f* which protrudes toward the second connection electrode 211. The second connection electrode 211 may include a concave portion 211*f* corresponding to the convex portion 212*f*.

Referring to FIG. 8, the first electrode pad 262, the second electrode pad 263, and the heat dissipation pad 261 disposed between the first electrode pad 262 and the second electrode pad 263 may be disposed on a lower surface of the first sublayer 210. The heat dissipation pad 261 may be larger than the first electrode pad 262 and the second electrode pad 263 for heat dissipation but is not limited thereto.

Referring to FIG. 9, the first connection electrode 212 may electrically connect the first electrode 221 to the first electrode pad 262. A first through electrode (not shown) may be disposed in a first through hole 221*a* of the first electrode 221 and a second through hole 212*a* of the first connection electrode 212 and thus be electrically connected to the first electrode pad 262 at a connection point 262*a*.

In addition, the second connection electrode 211 may electrically connect the third to sixth electrodes 223, 224, 225, and 226 to the second electrode pad 263. For example, a second through electrode (not shown) may be disposed in a third through hole 225*a* of the fifth electrode 225 and a fourth through hole 211*a* of the second connection electrode 211 and thus be electrically connected to the second electrode pad 263 at connection points 263*a*.

Other electrodes such as the third electrode 223, the fifth electrode 225, and the sixth electrode 226 may be connected to the second electrode pad 263 by using the same method. That is, the second connection electrode 211 may be disposed to overlap the third to sixth electrodes 223, 224, 225, and 226.

For example, the third electrode 223 may be electrically connected to a third point 211*c* of the second connection electrode 211 by a through electrode, and the fourth electrode 224 may be electrically connected to a fourth point 211*d* of the second connection electrode 211 by a through electrode. The sixth electrode 226 may be electrically connected to a sixth point 211*b* of the second connection electrode 211 by a through electrode.

In addition, the third through electrode 227 may connect the first sublayer 210 and the second sublayer 220 to the heat dissipation pad 261 to improve heat dissipation performance. That is, the heat dissipation pad 261 may dissipate heat flowing through the first sublayer 210 and the second sublayer 220 without being directly connected to the first electrode 221. When the heat dissipation pad 261 is electrically connected to the first electrode 221, the heat dissipation pad 261 may have polarity and thus have disadvantages in heat dissipation and reliability.

The first to sixth electrodes 221, 222, 223, 224, 225, and 226, the first electrode pad 262, the heat dissipation pad 261, and the second electrode pad 263 may have a structure in which a plurality of metal layers are stacked. For example, the first to sixth electrodes 221 to 226, the first electrode pad 262, the heat dissipation pad 261, and the second electrode pad 263 may have a structure of W/Ni/Pd/Au. A thickness of W may be in a range of 5 μm to 15 μm, a thickness of Ni may be in a range of 4 μm to 6 μm, a thickness of Pd may be in a range of 0.05 μm to 0.15 μm, and a thickness of Au may be in a range of 0.4 μm to 0.6 μm, but the embodiments are not limited thereto. The first connection electrode 212 and the second connection electrode 211 are mainly provided to bond the first sublayer 210 to the second sublayer 220 and thus may be formed in a single layer of W having a thickness of 5 μm to 15 μm.

FIG. 10 is a conceptual diagram of the semiconductor device according to an embodiment of the present invention. FIG. 11 illustrates a modified example of FIG. 10.

Referring to FIG. 10, the semiconductor device 100 according to the embodiment may be mounted on a submount 22 like a flip chip. That is, a first electrode 152 and a second electrode 151 of the semiconductor device 100 may be mounted on a first pad 23*a* and a second pad 23*b* of a pad 23 the submount 22 in a flip chip form. The first pad 23*a* and the second pad 23*b* may be respectively soldered to the body 10 using wires W.

However, a method of mounting a semiconductor device is not particularly limited. For example, as shown in FIG. 11, a substrate 110 of a semiconductor device may be disposed on the submount 22, and the first electrode 152 and the second electrode 151 may be directly soldered to the body 10.

The semiconductor device according to the embodiment may include the substrate 110, a first conductive semiconductor layer 120, an active layer 130, and a second conductive semiconductor layer 140. Each of these semiconductor layers may have a composition of aluminum to emit light in an ultraviolet wavelength range.

The substrate 110 may include a conductive substrate or an insulating substrate. The substrate 110 may be a material appropriate for semiconductor material growth or a carrier wafer. The substrate 110 may include a material selected from among sapphire ($Al_2O_3$), SiC, GaAs, GaN, ZnO, Si, GaP, InP, and Ge but is not limited thereto. The substrate 110 may be removed as needed.

A buffer layer (not shown) may be further included between the first conductive semiconductor layer 120 and the substrate 110. The buffer layer may mitigate a lattice mismatch between the substrate 110 and a light-emitting structure 160 located on the substrate 110.

The first conductive semiconductor layer 120 may be embodied as a Group III-V or II-VI compound semiconductor and doped with a first dopant. The second conductive semiconductor layer 123 may be selected from among semiconductor materials having an empirical formula of $In_{x1}Al_{y1}Ga_{1-x1-y1}N$ ($0 \le x1 \le 1$, $0 \le y1 \le 1$, $0 \le x1+y1 \le 1$), e.g., GaN, AlGaN, InGaN, and InAlGaN. The first dopant may be an n-type dopant such as Si, Ge, Sn, Se, or Te. When the first dopant is an n-type dopant, the first conductive semiconductor layer 120 doped with the first dopant may be an n-type semiconductor layer.

The active layer 130 is a layer at which electrons (or holes) injected via the first conductive semiconductor layer 120 and holes (or electrons) injected via the second conductive semiconductor layer 140 meet. The active layer 130 may change to a low energy level as the electrons and the holes are recombined and generate light having a wavelength corresponding to the low energy level.

The active layer 130 may have, but is not limited to, a single well structure, a multi-well structure, a single quantum well structure, a multi-quantum well (MQW) structure, a quantum dot structure, or a proton beam structure.

The second conductive semiconductor layer 140 may be formed on the active layer 130, embodied as a Group III-V or II-VI compound semiconductor, and doped with a second dopant. The second conductive semiconductor layer 140 may be formed of a semiconductor material having an empirical formula of $In_{x5}Al_{y2}Ga_{1-x5-y2}N$ ($0 \leq x5 \leq 1$, $0 \leq y2 \leq 1$, $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, or Ba, the second conductive semiconductor layer 140 doped with the second dopant may be a p-type semiconductor layer.

The first electrode 152 may be electrically connected to the first conductive semiconductor layer 120. The second electrode 151 may be electrically connected to the second conductive semiconductor layer 140. The first and second electrodes 152 and 151 may be selected from among Ti, Ru, Rh, Ir, Mg, Zn, Al, In, Ta, Pd, Co, Ni, Si, Ge, Ag, Au, and an alloy thereof.

In the embodiment, the structure of a horizontal light-emitting element is described but the embodiments are not limited thereto. For example, a light-emitting element according to an embodiment may have a vertical structure or a flip-chip structure.

The semiconductor devices are applicable to various types of light source devices. For example, the light source devices may be a concept including a sterilizing device, a curing device, a lighting device, a display device, a vehicle lamp, and the like. That is, the semiconductor devices are applicable to various types of electronic devices each being arranged in a case to provide light.

The sterilizing device may be provided with a semiconductor device according to an embodiment to sterilize a desired area. The sterilizing device is applicable to, but is not limited to, household appliances such as water purifiers, air conditioners, and refrigerators. That is, the sterilizing device is applicable to various products (e.g., medical devices) that are required to be sterilized.

For example, a water purifier may include a sterilizing device according to an embodiment to sterilize water to circulate. The sterilizing device may be disposed on a nozzle or a discharge port through which water circulates to emit ultraviolet rays. In this case, the sterilizing device may include a waterproof structure.

The curing device may include a semiconductor device according to an embodiment to cure various types of liquids. The liquid may be a broadest concept including all of various materials that are cured when ultraviolet light is emitted thereto. For example, the curing device may be used to cure various types of resins. Alternatively, the curing device is applicable to curing beauty products such as nail polish.

The lighting device may include a light source module, which includes a substrate and a semiconductor device according to an embodiment, a heat dissipation unit which dissipates heat from the light source module, and a power supply which processes or converts an electrical signal received from the outside and provides the resultant signal to the light source module. Furthermore, the lighting device may include a lamp, a head lamp, a street light, or the like.

The display device may include a bottom cover, a reflecting plate, a light-emitting module, a light guide plate, an optical sheet, a display panel, an image signal output circuit, and a color filter. The bottom cover, the reflecting plate, the light-emitting module, the light guide plate, and the optical sheet may constitute a backlight unit.

The reflecting plate is disposed on the bottom cover, and the light-emitting module may emit light. The light guide plate is disposed in front of the reflecting plate to guide light emitted from the light-emitting module in a forward direction, and the optical sheet may include a prism sheet and the like and be disposed in front of the light-guide plate. A display panel is disposed in front of the optical sheet, an image signal output circuit supplies an image signal to the display panel, and a color filter can be disposed in front of the display panel.

When a semiconductor device is used as a backlight unit of a display device, the semiconductor device may be used as an edge-type backlight unit or a direct-type backlight unit.

The semiconductor device may be a laser diode, as well as the above-described light-emitting diode.

The laser diode may include a first conductive semiconductor layer, an active layer, and a second conductive semiconductor layer as described above, similar to the light-emitting element. The laser diode uses the electroluminescence phenomenon that light is emitted when a current is supplied after a p-type first conductive semiconductor and an n-type second conductive semiconductor are bonded together but is different from the light-emitting element in terms of the directivity and phase of emitted light. That is, the laser diode may emit light having one specific wavelength (monochromatic beam) to have the same phase in the same direction using the stimulated emission phenomenon and the constructive interference phenomenon. Due to the above characteristics, the laser diode is available for optical communication, medical equipment, semiconductor processing equipment, and the like.

Examples of the light-receiving element include a photodetector which is a type of transducer that detects light and converts the intensity of the light into an electric signal. Examples of the photodetector may include, but are not limited to, a photocell (silicon or selenium), a photoconductive element (cadmium sulfide or cadmium selenide), a photodiode (e.g., a photodiode with a peak wavelength in a visible blind spectral region or a true blind spectral region), a phototransistor, a photomultiplier tube, a phototube (vacuum or gas-filled), an infra-red (IR) detector, and the like.

A semiconductor device such as a photodetector may be manufactured using a direct bandgap semiconductor which generally has high photo-conversion efficiency. The photodetector may have various configurations. As photodetectors having most general configurations, there are a pin type photodetector using a p-n junction, a Schottky photodetector using a Schottky junction, a metal-semiconductor-metal (MSM) photodetector, and the like.

The photodiode may include a first conductive semiconductor layer, an active layer, and a second conductive semiconductor layer as described above, similar to the light-emitting element, and may have a pn junction structure or a pin structure. The photodiode is operated by applying a reverse bias or a zero bias. When light is incident on the photodiode, electrons and holes are generated and thus current flows. In this case, the amount of the current may be almost proportional to that of the light incident on the photodiode.

A photocell or a solar cell is a type of photodiode that converts light into a current. The solar cell may include a first conductive semiconductor layer, an active layer, and a second conductive semiconductor layer as described above, similar to the light-emitting element.

In addition, the semiconductor device is applicable as a rectifier of an electronic circuit owing to rectifying characteristic of a general diode using a p-n junction and is applicable to an oscillation circuit or the like when applied to a microwave circuit or the like.

The semiconductor device is not necessarily formed of a semiconductor and may further include a metal material in some cases. For example, a semiconductor device such as a light-receiving element may be formed of at least one of Ag, Al, Au, In, Ga, N, Zn, Se, P, or As, or formed of a semiconductor material doped with a p- or n-type dopant or an intrinsic semiconductor material.

While exemplary embodiments have been particularly described above, the present invention is not limited thereto, and it will be apparent to those of ordinary skill in the art that various modifications and applications may be made without departing from the essential features of the embodiments. For example, the components described in detail in the embodiments may be modified and implemented. It is to be understood that differences related to such modifications and applications fall within the scope of the present invention defined in the appended claims.

The invention claimed is:

1. A semiconductor device package comprising:
    a body including a cavity;
    a plurality of electrodes disposed inside the body;
    a semiconductor device electrically connected to the plurality of electrodes; and
    a transparent member disposed in the cavity,
    wherein the body comprises a first side surface and a second side surface facing each other, a third side surface and a fourth side surface facing each other, a first corner area formed by the first side surface and the third side surface, a second corner area formed by the first side surface and the fourth side surface, a third corner area formed by the second side surface and the fourth side surface, and a fourth corner area formed by the second side surface and the third side surface,
    the plurality of electrodes comprise a first electrode on which the semiconductor device is disposed and a second electrode, a third electrode, a fourth electrode, a fifth electrode, and a sixth electrode disposed outside the first electrode,
    the first electrode comprises a fifth side surface and a sixth side surface facing each other, a seventh side surface connecting the fifth side surface and the sixth side surface, a fifth corner area formed by the fifth side surface and the seventh side surface, and a sixth corner area formed by the sixth side surface and the seventh side surface,
    the fifth corner area is located between the second corner area and the third corner area,
    the sixth corner area is located between the third corner area and the fourth corner area,
    a gap between the fourth electrode and the fifth electrode is located between the fifth corner area and the fourth side surface,
    a gap between the fifth electrode and the sixth electrode is located between the sixth corner area and the second side surface, and
    wherein the third electrode has a triangular shape smaller in size than at least one of the fourth electrode, the fifth electrode and the sixth electrode and is disposed to point towards the first electrode.

2. The semiconductor device package of claim 1, wherein the second to sixth electrodes are disposed to be spaced apart from one another.

3. The semiconductor device package of claim 2, further comprising:
    a first electrode pad electrically connected to the first electrode, and
    a second electrode pad electrically connected to the third to sixth electrodes.

4. The semiconductor device package of claim 3, further comprising a heat dissipation pad disposed between the first electrode pad and the second electrode pad.

5. The semiconductor device package of claim 4, further comprising:
    a first connection electrode electrically connecting the first electrode to the first electrode pad, and
    a second connection electrode connecting the third to sixth electrodes to the second electrode pad.

6. The semiconductor device package of claim 1, wherein the second electrode extends to the first corner area, and the second electrode is connected to the first electrode.

7. The semiconductor device package of claim 6, further comprising a Zener diode disposed on the second electrode.

8. The semiconductor device package of claim 7, further comprising a wire electrically connecting the Zener diode to the third electrode.

9. The semiconductor device package of claim 1, wherein the body comprises a first division area, a second division area, a third division area, and a fourth division area defined by a first virtual line passing through centers of the first side surface and the second side surface and a second virtual line passing through centers of the third side surface and the fourth side surface,
    the first division area comprises the first corner area,
    the second division area comprises the second corner area,
    the third division area comprises the third corner area,
    the fourth division area comprises the fourth corner area,
    the second electrode and the third electrode are disposed in the first division area,
    the fourth electrode is disposed in the second division area,
    the fifth electrode is disposed in the third division area, and
    the sixth electrode is disposed in the fourth division area.

10. The semiconductor device package of claim 9, wherein the first electrode comprises a point of intersection of the first virtual line and the second virtual line.

11. The semiconductor device package of claim 9, wherein the fourth to sixth electrodes are larger than the third electrode.

12. The semiconductor device package of claim 11, wherein the first electrode is larger than the fourth to sixth electrodes.

13. The semiconductor device package of claim 11, wherein an area of the first electrode is greater than the sum of areas of the second to sixth electrodes.

14. The semiconductor device package of claim 1, wherein the semiconductor device comprises a first conductive semiconductor layer, a second conductive semiconductor layer, and an active layer disposed between the first conductive semiconductor layer and the second conductive semiconductor layer.

15. The semiconductor device package of claim 14, wherein the active layer generates light in an ultraviolet wavelength.

16. The semiconductor device package of claim 1, wherein a top surface of the transparent member is higher than a top surface of the body.

17. The semiconductor device package of claim 1, further comprising a resin disposed between the transparent member and the body.

18. The semiconductor device package of claim 1, wherein the body comprises a plurality of sub layers fixed to one another by an adhesive.

19. The semiconductor device package of claim 18, wherein the plurality of sub layers include a ceramic material.

20. The semiconductor device package of claim 19, further comprising a plurality of through electrodes penetrating the plurality of sub layers.

21. The semiconductor device package of claim 1, wherein the fifth corner area is located a spaced distance inside of outer side surfaces of the fourth electrode and the fifth electrode, and wherein the sixth corner area is located a spaced distance inside of outer side surfaces of the fifth electrode and the sixth electrode.

\* \* \* \* \*